(12) United States Patent
Vice

(10) Patent No.: US 7,786,822 B2
(45) Date of Patent: Aug. 31, 2010

(54) FOUR-STATE DIGITAL ATTENUATOR HAVING TWO-BIT CONTROL INTERFACE

(75) Inventor: Michael Wendell Vice, El Granada, CA (US)

(73) Assignee: Avago Technologies Wireless IP (Singapore) Pte. Ltd., Singapore (SG)

( * ) Notice: Subject to any disclaimer, the term of this patent is extended or adjusted under 35 U.S.C. 154(b) by 193 days.

(21) Appl. No.: 12/127,795

(22) Filed: May 27, 2008

(65) Prior Publication Data

US 2009/0295515 A1    Dec. 3, 2009

(51) Int. Cl.
*H01P 1/22*    (2006.01)
(52) U.S. Cl. .................................. 333/81 R; 327/308
(58) Field of Classification Search ............... 333/81 R, 333/81 A; 327/308, 309
See application file for complete search history.

(56) References Cited

U.S. PATENT DOCUMENTS 4,016,481 A    4/1977    Bradley

| 5,969,560 | A | * | 10/1999 | Kohama et al. ............. 327/308 |
| 6,211,729 | B1 | | 4/2001 | Morkner |
| 6,919,774 | B2 | * | 7/2005 | Ritchey et al. ............. 333/81 R |
| 7,525,395 | B2 | * | 4/2009 | Hwang et al. ............. 333/81 R |
| 2006/0097821 | A1 | * | 5/2006 | Ju et al. .................... 333/81 R |

FOREIGN PATENT DOCUMENTS

JP    9036677    2/1997

* cited by examiner

*Primary Examiner*—Stephen E Jones

(57) ABSTRACT

A four-state digital attenuator for an RF signal includes a first external terminal adapted to receive a first control voltage; a second external terminal adapted to receive a second control voltage, and a third external terminal connected to a fixed supply voltage. The four-state digital attenuator receives no supply voltages other than the control voltages and the fixed supply voltage connected to the third external terminal. A plurality of series paths are provided from an RF input to an RF output, each of the series paths passing through a node. A plurality of shunt paths are provided from the node to the third external terminal. A driver selectively enables the series paths and shunt paths in response to the first and second control voltages to provide four attenuation levels for an RF signal from the RF input to the RF output.

20 Claims, 4 Drawing Sheets

FOUR-STATE DIGITAL ATTENUATOR HAVING TWO-BIT CONTROL INTERFACE

BACKGROUND

Radio Frequency (RF) signals and components are employed in a variety of devices, including mobile communication devices such as mobile telephones. One type of commonly employed RF component is an RF attenuator, which is sometimes employed to control an RF signal level in a device that employs RF signals.

One type of attenuator for RF signals is called a digital attenuator. In general, a digital attenuator responds to N digital control bits to select one of $2^N$ available attenuator states for an RF signal. In one particularly popular configuration, a four-state digital attenuator provides four specific selectable levels of RF attenuation, or four states, in response to two control bits. In general, a four-state digital attenuator includes a driver with at least two control lines (for the two control bits), a power supply line, and a ground line. Adding the RF input and output ports means that a total of five terminals, plus ground, are required. Each terminal has cost and size ramifications for the component.

In some known configurations of digital attenuators, the RF input port and RF output port are diplexed with the two control lines. However, in that case the digital attenuator still requires a minimum of three terminals plus ground.

What is needed, therefore, is a digital attenuator that can operate with fewer terminals. What is needed in particular is a four-state digital attenuator that requires fewer terminals.

SUMMARY

In an example embodiment, a four-state digital attenuator comprises: a first external terminal adapted to receive a first control voltage; a second external terminal adapted to receive a second control voltage; a third external terminal connected to a fixed supply voltage; a plurality of series paths from an RF input to an RF output, each of the series paths passing through a node; a plurality of shunt paths from the node to the third external terminal; and a driver for selectively enabling the series paths and shunt paths in response to the first and second control voltages to provide four attenuation levels for an RF signal from the RF input to the RF output, wherein the four-state digital attenuator receives no supply voltages other than the control voltages and the one fixed supply voltage.

In another example embodiment, a four-state digital attenuator comprises: a first external terminal adapted to receive a first control voltage and an RF input signal; a second external terminal adapted to receive a second control voltage and to provide an RF output signal; and a third external terminal connected to a fixed supply voltage; wherein, in response to the first and second control voltages, the four-state digital attenuator attenuates the RF input signal by a selected attenuation value among four available attenuation values to produce the RF output signal, and wherein the four-state digital attenuator has no external terminals other than the first, second and third external terminals.

In yet another example embodiment, a four-state digital attenuator comprises: a first external terminal adapted to receive a first control voltage; a second external terminal adapted to receive a second control voltage; a third external terminal connected to a fixed supply voltage; a fourth external terminal adapted to receive an RF input signal; and a fifth external terminal adapted to provide an RF output signal; wherein, in response to the first and second control voltages, the four-state digital attenuator attenuates the RF input signal by a selected attenuation value among four available attenuation values to produce the RF output signal, and wherein the four-state digital attenuator has no external terminals other than the first, second, third, fourth and fifth external terminals.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

In the following detailed description, for purposes of explanation and not limitation, example embodiments disclosing specific details are set forth in order to provide a thorough understanding of an embodiment according to the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparati and methods may be omitted so as to not obscure the description of the example embodiments. Such methods and apparati are clearly within the scope of the present teachings.

As used herein, the term "radio frequency" or "RF" pertains to VHF, UHF, SHF and even millimeter wave frequencies to the extent that technology permits the devices and circuits disclosed herein to be fabricated and operated at such frequencies. Also, unless otherwise noted, when a first device is said to be connected to a second device, this encompasses cases where one or more intermediate devices may be employed to connect the two devices to each other.

Figure 1:
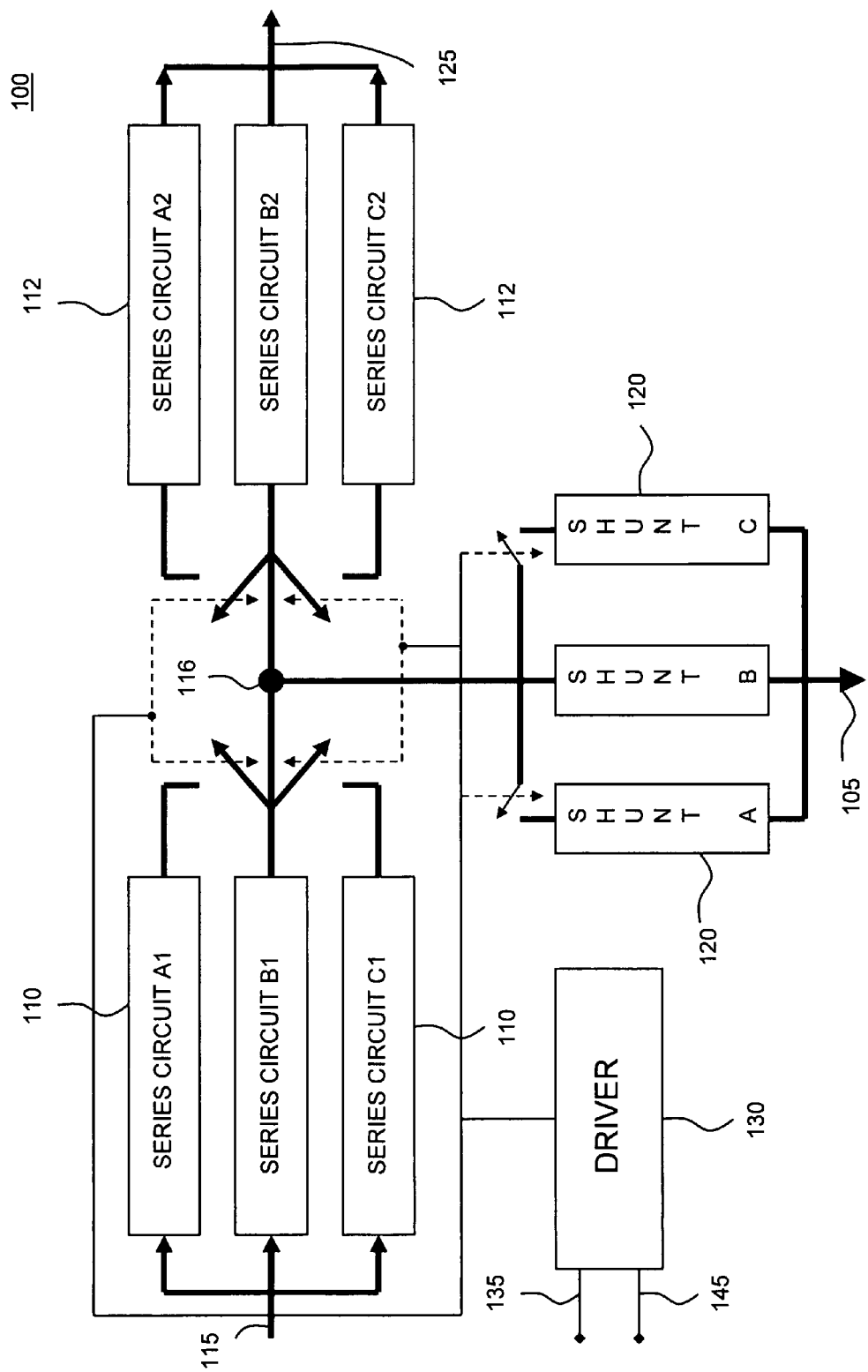
FIG. 1 shows a functional block diagram of one embodiment of a four-state digital attenuator.

FIG. 1 shows a functional block diagram of one embodiment of a four-state digital attenuator.

Attenuator 100 includes an RF input 115, an RF output 125, a plurality of input series paths 110, a plurality of output series paths 112, a plurality of shunt paths 120, and a driver 130. In general, each of the input series paths 110 has a different series impedance, and each of the output series paths 112 has a different series impedance.

Attenuator 100 has a so-called "T" configuration of an input series circuit from RF input 115 to an intermediate node 116, a shunt circuit from the intermediate node 116 to a supply voltage (e.g., ground 105), and an output series circuit from intermediate node 116 to RF output 125.

Operationally, attenuator 100 attenuates the RF input signal at RF input 115 by a selected one of four possible attenuation levels to produce an attenuated RF output signal at RF output 125. Driver 130 responds to first and second control voltages 135 and 145 to selectively enable series paths between RF input 115 and RF output 125, and shunt paths from node 116 to a fixed supply voltage (e.g., ground) 105, where the series paths are formed by pairs of the input series paths 110 and output series paths 112. Different combinations of series paths and shunt paths yield different attenuation values for attenuator 100. In general, selection of input series paths 110 is not exclusive, that is, more than one path may be enabled at a time by driver 130 to yield a desired attenuation value while maintaining a desired impedance characteristic. Similarly, driver 130 may enable more than one output series path 112 at a time, and more than one shunt path 120 at a time, to yield a desired attenuation value while maintaining a desired impedance characteristic.

Each control voltage 135 and 145 can have two levels (i.e., "high" and "low") thus yielding four possible combinations of selected series paths and shunt paths 120. Table 1 below shows one possible Truth Table for attenuator 100. However, it should be understood that alternative embodiments can be arranged such that each of the four possible combinations of control voltage levels can yield any of the four possible attenuation levels.

TABLE 1

| 1st Control Voltage | 2nd Control Voltage | Attenuation |
|---|---|---|
| HIGH | LOW | MINIMUM (e.g., 1 dB) |
| LOW | HIGH | HIGH (e.g., 12 dB) |
| HIGH | HIGH | MAXIMUM (e.g., 22 dB) |
| LOW | LOW | LOW (e.g., 7 dB) |

Of significance, attenuator 100 is powered by the control voltages VC1 and VC2, and the single supply voltage (e.g., ground) 105, without the need for any other supply voltages.

Figure 2:
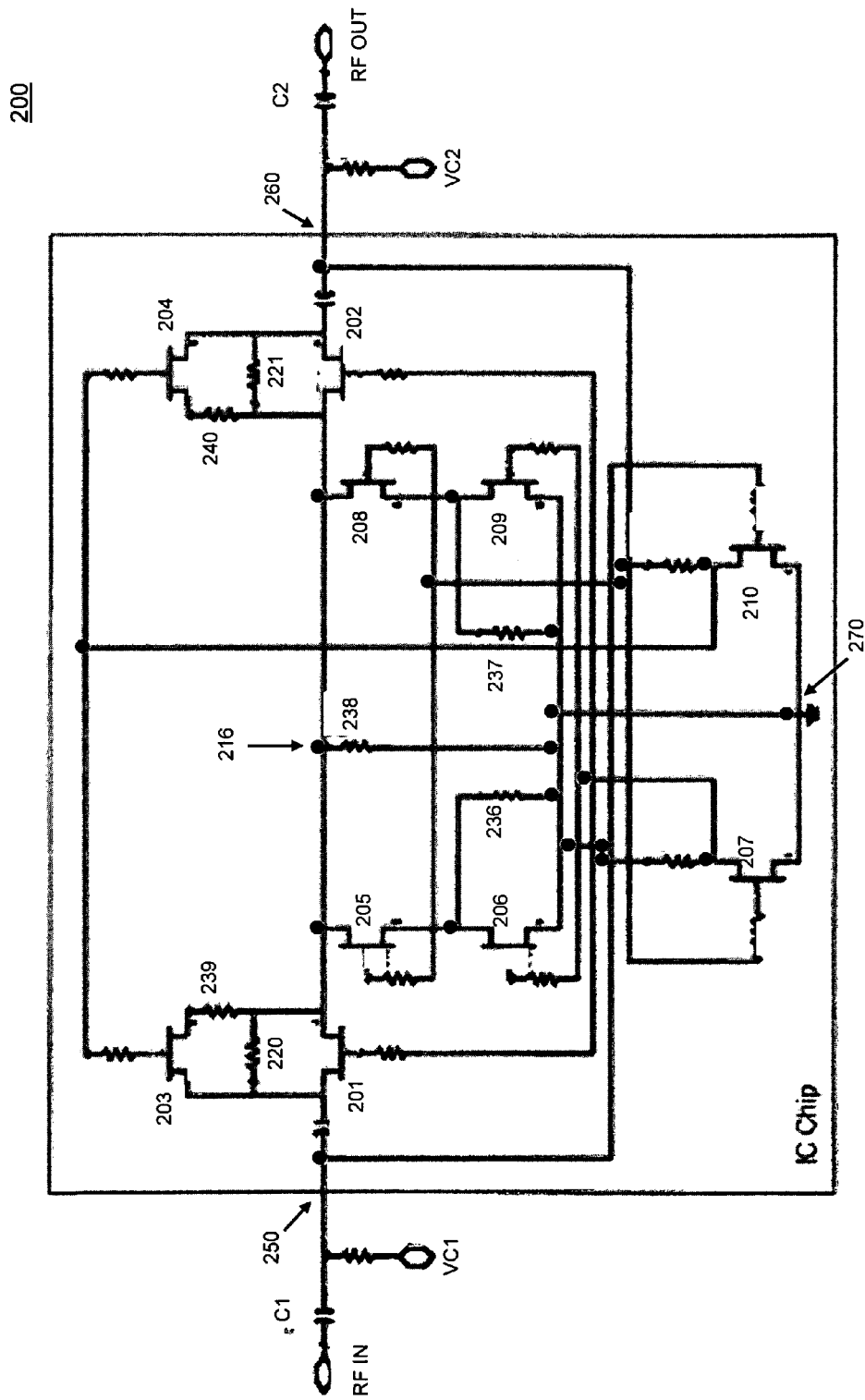
FIG. 2 shows a schematic diagram of another embodiment of a four-state digital attenuator.

FIG. 2 shows a schematic diagram of another embodiment of a four-state digital attenuator 200. Attenuator 200 may be one embodiment of attenuator 100. Among other components, attenuator 200 includes: first external terminal 250, second external terminal 260, and third external terminal 270; field effect transistors (FETs) 201, 202, 203, 204, 205, 206, 207, 208, 209 and 210; and resistors 220, 221, 236, 237, 238, 239 and 240. In one embodiment, all of the FETs are enhancement mode FETs.

First external terminal 250 is adapted to receive a first control voltage VC1, second external terminal 260 is adapted to receive a second control voltage VC2, and third external terminal 270 is connected to a fixed supply voltage (e.g., ground). First external terminal 250 also serves as an RF input for attenuator 200, with DC blocking capacitor C1 isolating the first control voltage VC1 and the RF input signal RF IN. Second external terminal 260 also serves as an RF output for attenuator 200, with DC blocking capacitor C2 isolating the second control voltage VC2 and the RF output signal RF OUT. That is, in attenuator 200, the first control voltage VC1 is diplexed with the RF input signal, and the second control voltage VC2 is diplexed with the RF output signal.

In general, FETs 201-204, 205-206, and 208-209 and their surrounding elements form a four-state attenuator, and FETs 207 and 210 with their surrounding resistors form a driver. In particular: FETs 201 and 203, together with resistors 220 and 239 provide an input series circuit; FETs 202 and 204 and resistors 221 and 240 form an output series circuit; and FETs 205, 206, 208 and 209 and resistors 236, 237 and 238 form a shunt circuit from intermediate node 216 to the fixed supply voltage (e.g., ground).

Operationally, in response to first and second control voltages VC1 and VC2 received at first and second external terminals 250 and 260, respectively, attenuator 200 attenuates the RF input signal received at first external terminal 250 by a selected one of four possible attenuation levels to produce an attenuated RF output signal which is provided at second external terminal 260. In particular, in response to control voltages VC1 and VC2, the driver selects one of four different attenuation states by selectively turning on and off pairs of the series FETs 201-204 and the shunt FETs 205-206 and 208-209. These four attenuation states will now all be described in more detail.

FIRST STATE. VC1=HIGH; VC2=LOW; FET 207 Gate=LOW; FET 207 Drain=HIGH; FET 210 Gate=HIGH; FET 210 Drain=LOW; FETs 201, 202, 206 and 209 are ON; FETs 203, 204, 205 and 208 are OFF; attenuation=minimum (e.g., 1 dB). The attenuation in the first state is set by the sizes of FETs 201-202.

SECOND STATE. VC1=LOW; VC2=HIGH; FET 207 Gate=HIGH; FET 207 Drain=LOW; FET 210 Gate=LOW; FET 210 Drain=HIGH; FETs 201, 202, 206 and 209 are OFF; FETs 203, 204, 205 and 208 are ON; attenuation=high (e.g., 12 dB). The attenuation in the second state is set by the values of resistors 220, 221, 236, 237, 239 and 240.

THIRD STATE. VC1=HIGH; VC2=HIGH; FET 207 Gate=HIGH; FET 207 Drain=LOW; FET 210 Gate=HIGH; FET 210 Drain=LOW; FETs 201, 202, 203 and 204 are OFF; FETs 205, 206, 209 and 208 are ON; attenuation=maximum (e.g., 22 dB). The attenuation in the third state is set by the sizes of FETs 205, 206, 208 and 209, together with the values of resistors 220 and 221.

FOURTH STATE. VC1=LOW; VC2=LOW; FET 207 Gate=LOW; FET 207 Drain=LOW; FET 210 Gate=LOW; FET 210 Drain=LOW; FETs 201-210 are OFF; attenuation=low (e.g., 17 dB). The attenuation in the fourth state is set by the values of resistors 220 and 221.

In one particular exemplary embodiment: FETs 201 and 202 are 200 μm in size; FETs 203 and 204 are 100 μm in size; FETs 205 and 206 are 125 μm in size; FETs 208 and 209 are 125 μm in size; FETs 207 and 210 are 25 μm in size; resistors 220 and 221 are 52Ω; 239 and 240 are 58Ω; and resistors 236 and 237 are 50Ω.

Of significance, attenuator 200 is powered by the control voltages VC1 and VC2, and the supply voltage (e.g., ground) connected to the third external terminal 270, without the need for any other supply voltages. Thus, attenuator 200 has a total of only three external terminals 250, 260 and 270.

Figure 3:
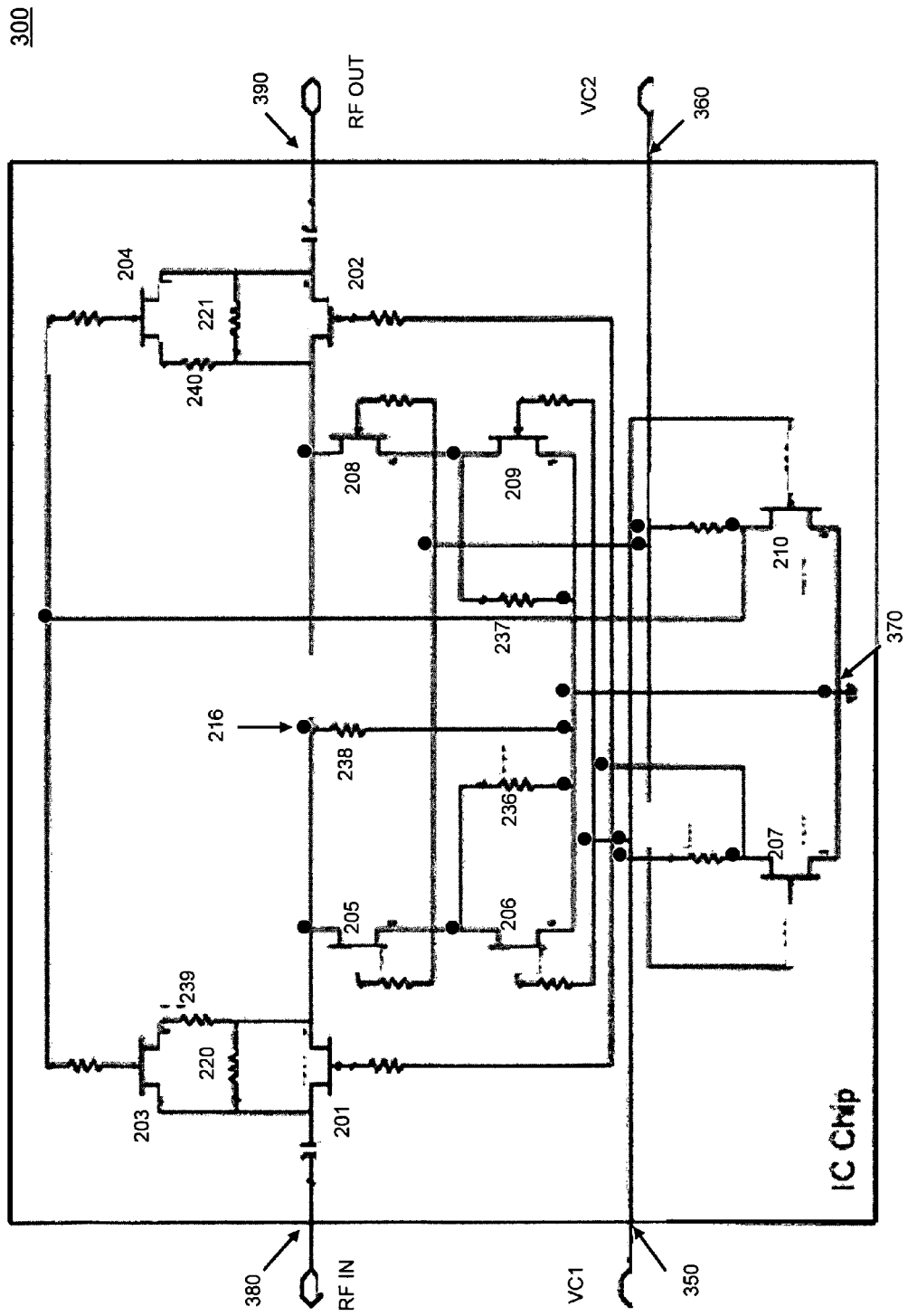
FIG. 3 shows a schematic diagram of yet another embodiment of a four-state digital attenuator.

FIG. 3 shows a schematic diagram of yet another embodiment of a four-state digital attenuator 300.

Attenuator 300 is similar to attenuator 200, except in attenuator 300 the control voltages VC1 and VC2 are not diplexed with the RF input and output signals. Therefore, attenuator 300 includes first external terminal 350, second external terminal 360, third external terminal 370, fourth external terminal 380 and fifth external terminal 390. First external terminal 350 is adapted to receive a first control voltage VC1, second external terminal 360 is adapted to receive a second control voltage VC2, third external terminal 370 is connected to a fixed supply voltage (e.g., ground); fourth external terminal 380 is adapted to receive an RF input signal; and fifth external terminal 390 is adapted to output an RF output signal.

Operationally, in response to first and second control voltages VC1 and VC2 received at first and second external terminals 350 and 360, respectively, attenuator 300 attenuates the RF input signal received at fourth external terminal 380 by a selected one of four possible attenuation levels to produce an attenuated RF output signal which is provided at fifth external terminal 390. The internal operation of the FETs 201-210 and the resistors 220, 221, 236-240 is the same as in attenuator 200 and so will not be repeated here.

Of significance, attenuator 300 is powered by the control voltages VC1 and VC2, and the supply voltage (e.g., ground)

connected to the third external terminal 370, without the need for any other supply voltages. Thus, attenuator 300 has a total of only five external terminals 350, 360, 370, 380 and 390.

In the embodiments of four-state attenuators 200 and 300 shown in FIGS. 2 and 3, transistors 208 and 209, and resistor 237, are operating in redundant fashion to transistors 205 and 206, and resistor 236 to provide two shunt paths from intermediate node 216 to ground. In an alternative embodiment, these two shunt paths could be combined into one shunt path. In particular, with respect to FIG. 2, transistors 208 and 209 and resistor 237 could be eliminated. In that case: the fifth transistor 205 would be replaced with a new fifth transistor which has the combined width of transistors 205 and 208 of FIG. 2; the sixth transistor 206 would be replaced with a new sixth transistor which has the combined width of transistors 206 and 209 of FIG. 2; and the resistor 236 would be replaced with a new resistor which has the combined conductance of resistors 236 and 237 of FIG. 2. A similar modification could be made to the four-state attenuator 300 of FIG. 3.

Figure 4:
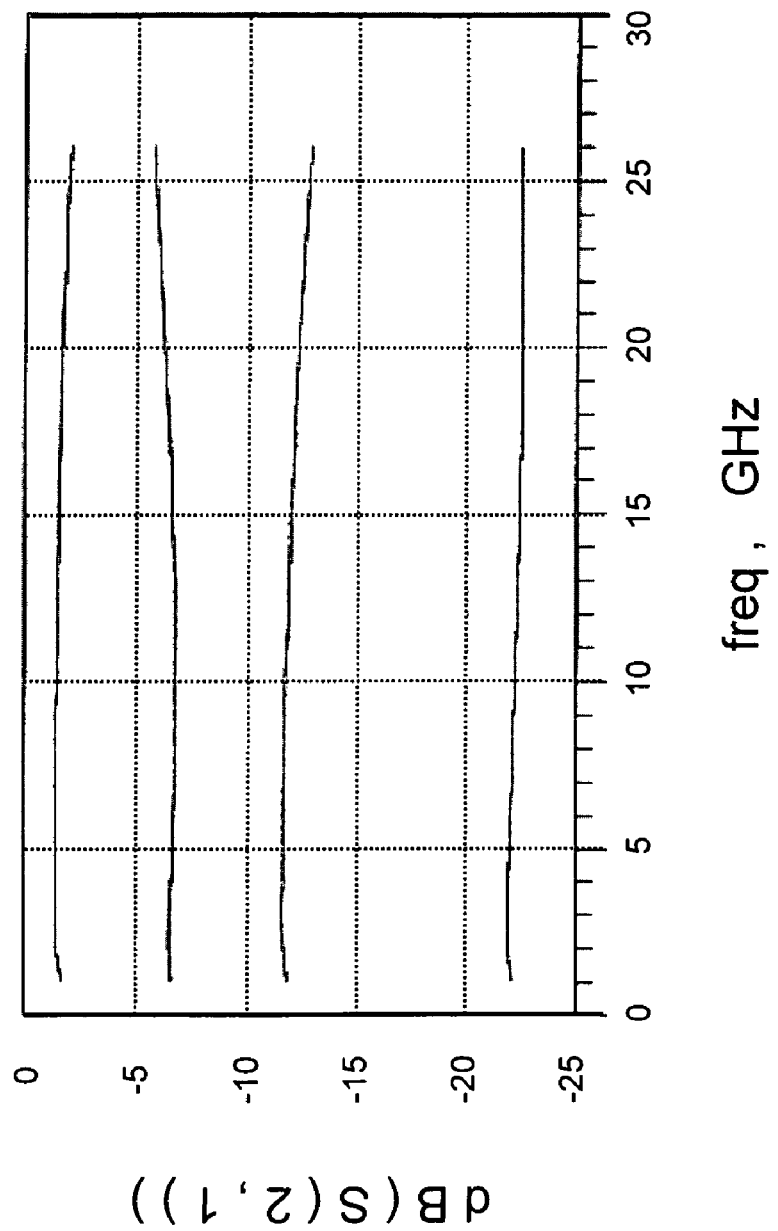
FIG. 4 shows attenuation values versus frequency for four different attenuation states for a four-state digital attenuator.

FIG. 4 shows attenuation values versus frequency from 1 to 25 GHz for four different attenuation states for attenuators 200 and 300.

While example embodiments are disclosed herein, one of ordinary skill in the art appreciates that many variations that are in accordance with the present teachings are possible and remain within the scope of the appended claims. The embodiments therefore are not to be restricted except within the scope of the appended claims.

The invention claimed is:

1. A four-state digital attenuator, comprising:
a first external terminal adapted to receive a first control voltage;
a second external terminal adapted to receive a second control voltage;
a third external terminal connected to a fixed supply voltage;
a plurality of series paths from an RF input to an RF output, each of the series paths passing through a node;
a plurality of shunt paths from the node to the third external terminal; and
a driver for selectively enabling the series paths and shunt paths in response to the first and second control voltages to provide four attenuation levels for an RF signal from the RF input to the RF output,
wherein the four-state digital attenuator receives no supply voltages other than the control voltages and the one fixed supply voltage.

2. The four-state digital attenuator of claim 1, where the fixed supply voltage is ground, and the third external terminal is a ground terminal.

3. The four-state digital attenuator of claim 1, further comprising a fourth external terminal for the RF input and a fifth external terminal for the RF output, and the four-state digital attenuator has no other external terminals other than the first, second, third, fourth and fifth external terminals.

4. The four-state digital attenuator of claim 3, wherein the plurality of series paths include:
a first path comprising a first transistor in series with a second transistor;
a second path comprising a third transistor in series with a fourth transistor and further in series with a first impedance; and
a third path comprising a second impedance.

5. The four-state digital attenuator of claim 1, wherein the RF input is the first external terminal and the RF output is the second external terminal, and the four-state digital attenuator has no other external terminals other than the first, second and third external terminals.

6. The four-state digital attenuator of claim 5, wherein the plurality of series paths include:
a first path comprising a first transistor in series with a second transistor;
a second path comprising a third transistor in series with a fourth transistor and further in series with a first impedance; and
a third path comprising a second impedance.

7. The four-state digital attenuator of claim 6, wherein the first and second transistors are turned on in response to the first control voltage being high and the second control voltage being low, and otherwise the first and second transistors are turned off, and wherein the third and fourth transistors are turned on in response to the first control voltage being low the second control voltage being high, and otherwise the third and fourth transistors are turned off.

8. The four-state digital attenuator of claim 6, wherein the plurality of shunt paths include:
a first shunt path comprising a resistor connected between the node and the third external terminal; and
a second shunt path comprising a fifth transistor in series with a parallel combination of a sixth transistor and a third impedance.

9. The four-state digital attenuator of claim 8, further comprising a third shunt path comprising a seventh transistor in series with a parallel combination of an eighth transistor and a fourth impedance.

10. The four-state digital attenuator of claim 9, wherein the fifth and seventh transistors are turned on and off in response to the second control voltage, and wherein the sixth and eighth transistors are turned on and off in response to the first control voltage.

11. A four-state digital attenuator, comprising:
a first external terminal adapted to receive a first control voltage and an RF input signal;
a second external terminal adapted to receive a second control voltage and to provide an RF output signal; and
a third external terminal connected to a fixed supply voltage;
wherein, in response to the first and second control voltages, the four-state digital attenuator attenuates the RF input signal by a selected attenuation value among four available attenuation values to produce the RF output signal, and
wherein the four-state digital attenuator has no external terminals other than the first, second and third external terminals.

12. The four-state digital attenuator of claim 11, wherein in response to the first control voltage being high, and the second control voltage being low, the selected attenuation value is a minimum among the four available attenuation values, wherein in response to the first control voltage being low, and the second control voltage being high, the selected attenuation value is a third lowest among the four available attenuation values, wherein in response to the first control voltage being high, and the second control voltage being high, the selected attenuation value is a maximum among the four available attenuation values, and wherein in response to the first control voltage being low, and the second control voltage being low, the selected attenuation value is a second lowest among the four available attenuation values.

13. The four-state digital attenuator of claim 11, where the fixed supply voltage is ground, and the third external terminal is a ground terminal.

14. The four-state digital attenuator of claim 11, wherein the four-state digital attenuator receives no supply voltages other than the control voltages and the fixed supply voltage.

15. The four-state digital attenuator of claim 14, wherein the minimum attenuation value is 1 dB, the second lowest attenuation value is 7 dB, the second highest attenuation value is 12 dB, and the highest attenuation value is 22 dB, and wherein the attenuation values are provided over a frequency range for the RF input signal of 1-25 GHz.

16. A four-state digital attenuator, comprising:
- a first external terminal adapted to receive a first control voltage;
- a second external terminal adapted to receive a second control voltage;
- a third external terminal connected to a fixed supply voltage;
- a fourth external terminal adapted to receive an RF input signal; and
- a fifth external terminal adapted to provide an RF output signal;
- wherein, in response to the first and second control voltages, the four-state digital attenuator attenuates the RF input signal by a selected attenuation value among four available attenuation values to produce the RF output signal, and
- wherein the four-state digital attenuator has no external terminals other than the first, second, third, fourth and fifth external terminals.

17. The four-state digital attenuator of claim 16, wherein the four-state digital attenuator receives no supply voltages other than the control voltages and the one fixed supply voltage.

18. The four-state digital attenuator of claim 16, where the fixed supply voltage is ground, and the third external terminal is a ground terminal.

19. The four-state digital attenuator of claim 16, wherein in response to the first control voltage being high, and the second control voltage being low, the selected attenuation value is a minimum among the four available attenuation values, wherein in response to the first control voltage being low, and the second control voltage being high, the selected attenuation value is a third lowest among the four available attenuation values, wherein in response to the first control voltage being high, and the second control voltage being high, the selected attenuation value is a maximum among the four available attenuation values, and wherein in response to the first control voltage being low, and the second control voltage being low, the selected attenuation value is a second lowest among the four available attenuation values.

20. The four-state digital attenuator of claim 19, wherein the minimum attenuation value is 1 dB, the second lowest attenuation value is 7 dB, the second highest attenuation value is 12 dB, and the highest attenuation value is 22 dB, and wherein the attenuation values are provided over a frequency range for the RF input signal of 1-25 GHz.

* * * * *